US009742174B2

(12) United States Patent
Caille et al.

(10) Patent No.: US 9,742,174 B2
(45) Date of Patent: Aug. 22, 2017

(54) REMOVABLE ELECTRICAL-ACCESSORY MODULE, AN ELECTRICAL BOX FOR RECEIVING SUCH AN ACCESSORY MODULE, AND A REPLACEMENT METHOD FOR REPLACING SUCH AN ACCESSORY MODULE

(71) Applicants: LEGRAND FRANCE, Limoges (FR); LEGRAND SNC, Limoges (FR)

(72) Inventors: Jean-Loup Caille, Peyrilhac (FR); Laurent Maziere, Feytiat (FR)

(73) Assignees: LEGRAND FRANCE, Limoges (FR); LEGRAND SNC, Limoges (FR)

( * ) Notice: Subject to any disclaimer, the term of this patent is extended or adjusted under 35 U.S.C. 154(b) by 97 days.

(21) Appl. No.: 14/648,284

(22) PCT Filed: Dec. 17, 2013

(86) PCT No.: PCT/FR2013/053128
§ 371 (c)(1),
(2) Date: May 29, 2015

(87) PCT Pub. No.: WO2014/096679
PCT Pub. Date: Jun. 26, 2014

(65) Prior Publication Data
US 2015/0311687 A1    Oct. 29, 2015

(30) Foreign Application Priority Data

Dec. 20, 2012 (FR) ...................................... 12 03507

(51) Int. Cl.
*H02G 3/12* (2006.01)
*H02G 3/18* (2006.01)
(Continued)

(52) U.S. Cl.
CPC ............... *H02G 3/12* (2013.01); *H02G 3/083* (2013.01); *H02G 3/123* (2013.01); *H02G 3/18* (2013.01); *H05K 13/0023* (2013.01)

(58) Field of Classification Search
CPC ............ H02G 3/12; H02G 3/18; H02G 3/083; H02G 3/10; H02G 3/08; H02G 3/081;
(Continued)

(56) References Cited

U.S. PATENT DOCUMENTS 3,620,404 A * 11/1971 Grasso .................... E04F 19/08
174/503
3,746,931 A * 7/1973 Muranaka ................. G04F 3/06
174/503

(Continued)

FOREIGN PATENT DOCUMENTS

DE    70 30 837 U    8/1972
DE    90 00 234 U1   2/1990
(Continued)

OTHER PUBLICATIONS

International Search Report, dated Feb. 19, 2014, from corresponding PCT application.

*Primary Examiner* — Angel R Estrada
(74) *Attorney, Agent, or Firm* — Young & Thompson

(57) ABSTRACT

An electrical-accessory module (130) for engaging in an electrical box (110) includes a casing (131) made of insulating material, and that includes a side wall (132) that is closed at the front by a front wall (134) for defining an inside space for receiving an electrical mechanism (140). The electrical-accessory module includes firstly snap-fastener elements (137) adapted to catch onto the electrical box, which snap-fastener elements include at least one catch member (137A) that is movable between a retracted position in which it does not hinder the insertion of the casing into the electrical box, and an extended position in which it is (Continued)

adapted to catch directly onto the electrical box, and secondly release elements (137C) for releasing the snap-fastener elements, which release elements are accessible via the front, through an access opening (139) provided in the front wall, so as to return the catch member into its retracted position.

26 Claims, 5 Drawing Sheets

(51) Int. Cl.
*H02G 3/08* (2006.01)
*H05K 13/00* (2006.01)

(58) Field of Classification Search
CPC ...... H02G 3/123; H05K 13/0023; H05K 5/00; H05K 5/02; H05K 5/0217
USPC ............... 174/50, 53, 57, 58, 502, 480, 481; 220/3.2, 3.3, 3.8, 4.02; 439/535
See application file for complete search history.

(56) References Cited

U.S. PATENT DOCUMENTS

| | | | | |
|---|---|---|---|---|
| 3,879,101 | A * | 4/1975 | McKissic | H01R 13/70 439/535 |
| 4,636,914 | A * | 1/1987 | Belli | H02G 3/086 174/53 |
| 4,669,804 | A * | 6/1987 | Munroe | H02G 3/18 439/535 |
| 5,223,673 | A * | 6/1993 | Mason | H02G 3/16 174/53 |
| 6,870,099 | B1 * | 3/2005 | Schultz | H02G 3/14 174/50 |
| 7,903,412 | B2 * | 3/2011 | Spivey | H05K 7/20445 174/520 |
| 7,994,436 | B2 * | 8/2011 | Yamamoto | H01R 25/006 174/50 |
| 9,362,729 | B2 * | 6/2016 | Wade | H02G 3/10 |

FOREIGN PATENT DOCUMENTS

| | | |
|---|---|---|
| DE | 91 06 123 U1 | 8/1991 |
| DE | 100 20 216 A1 | 10/2001 |

* cited by examiner

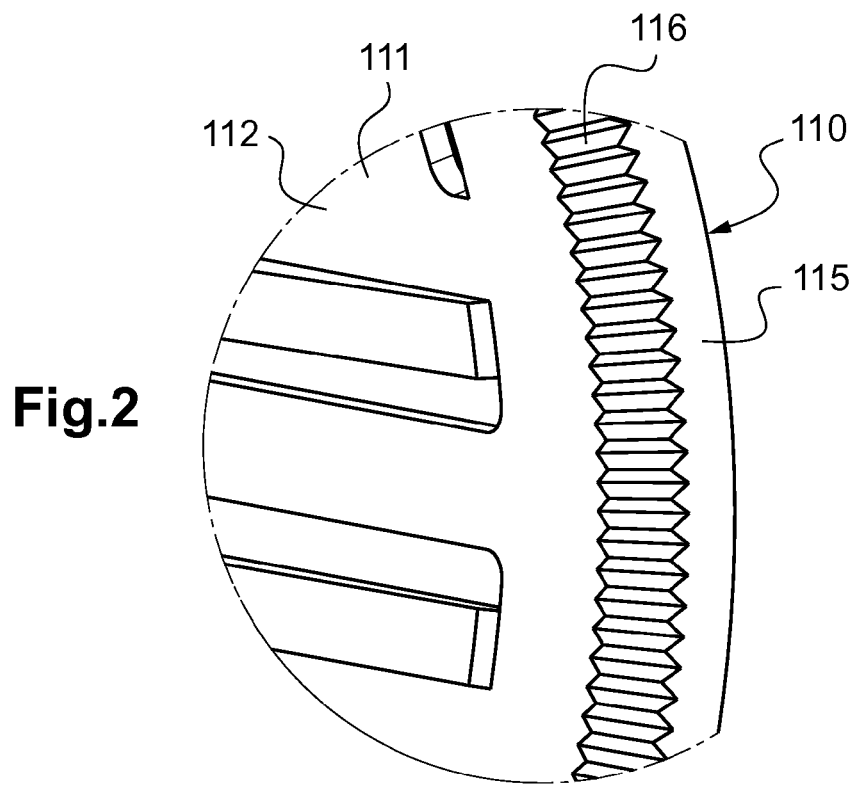
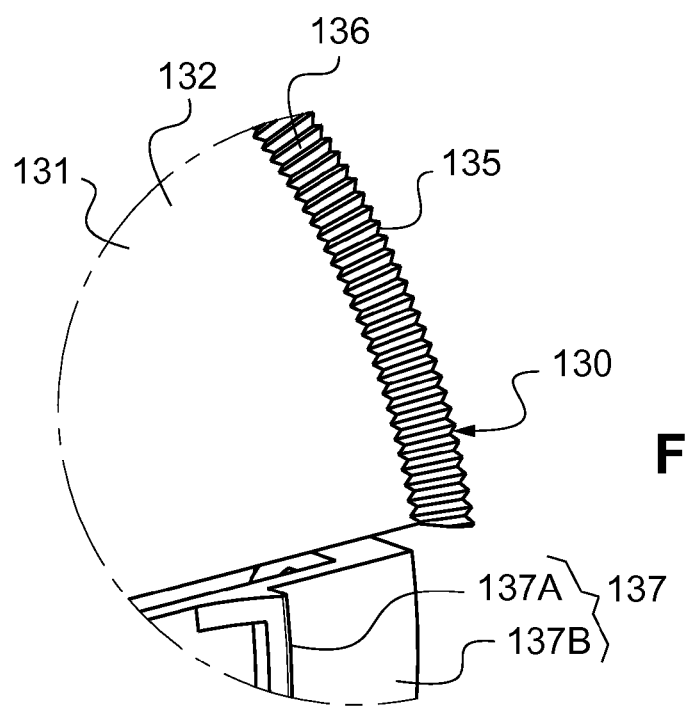

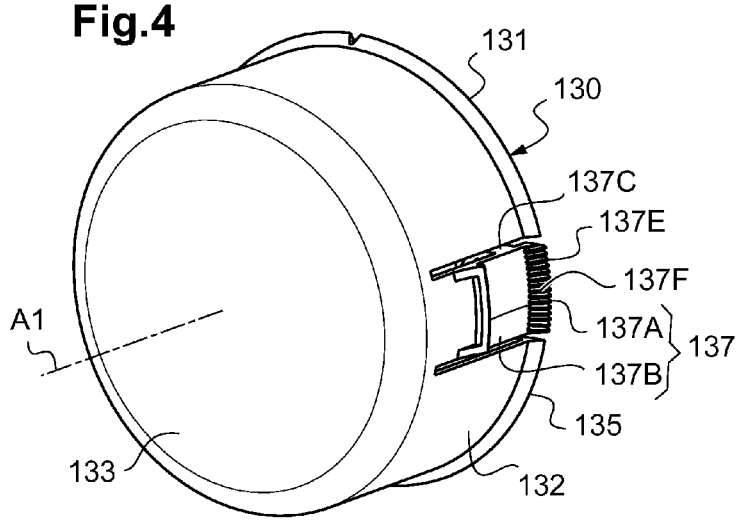
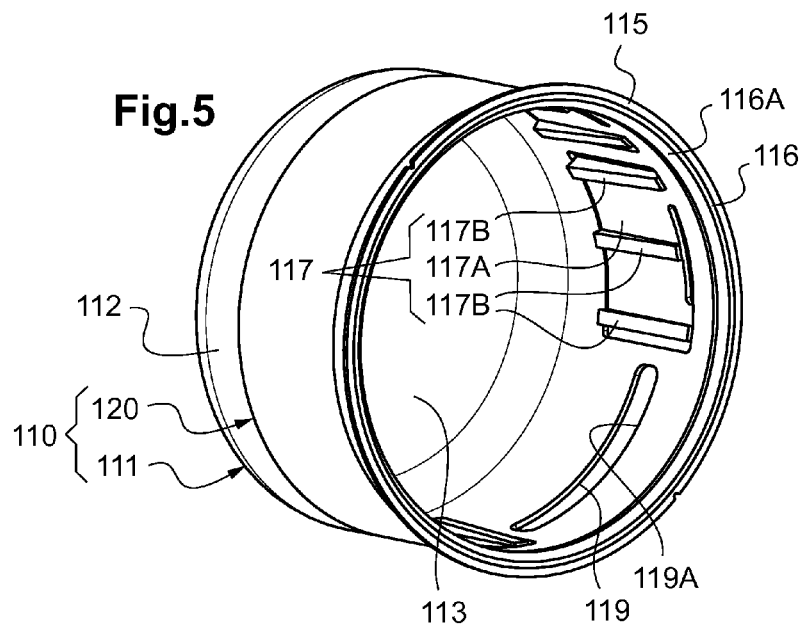

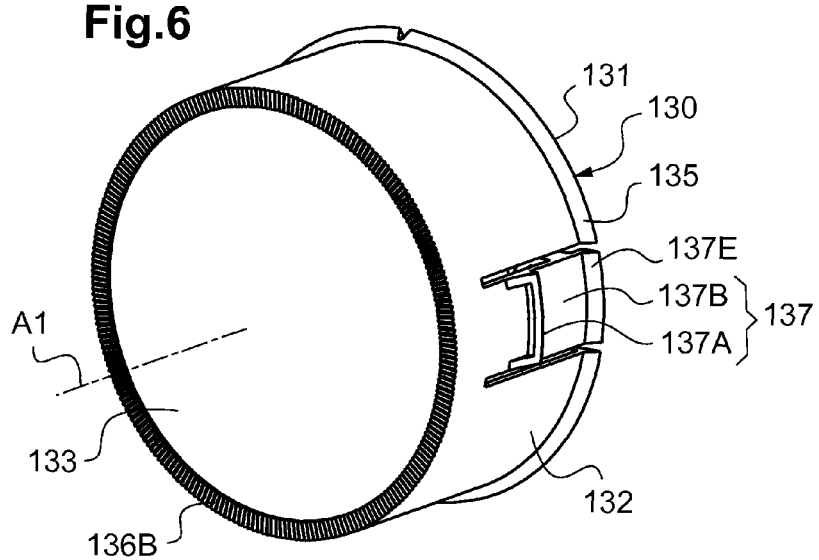
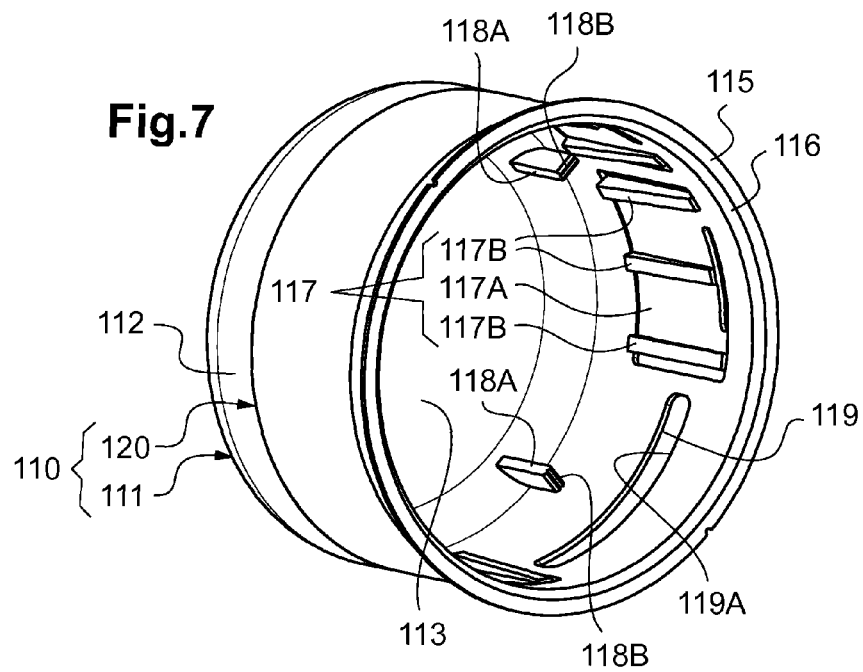

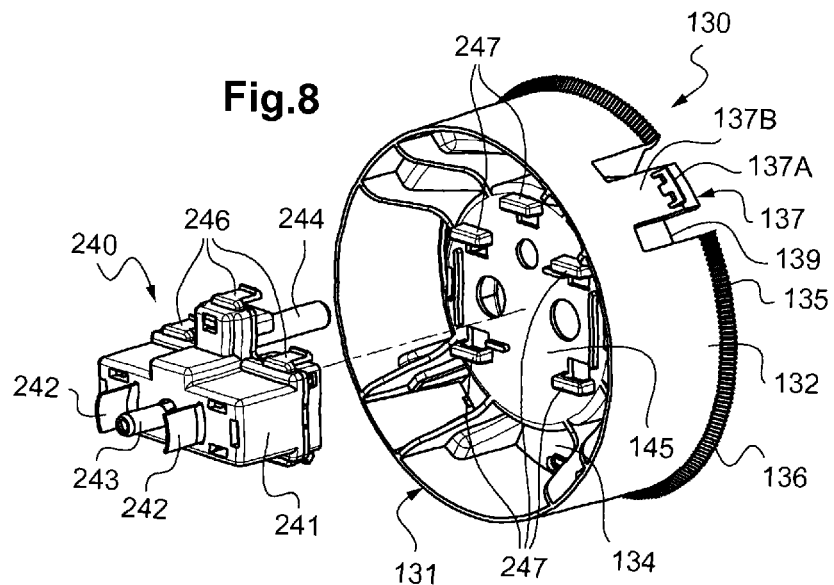
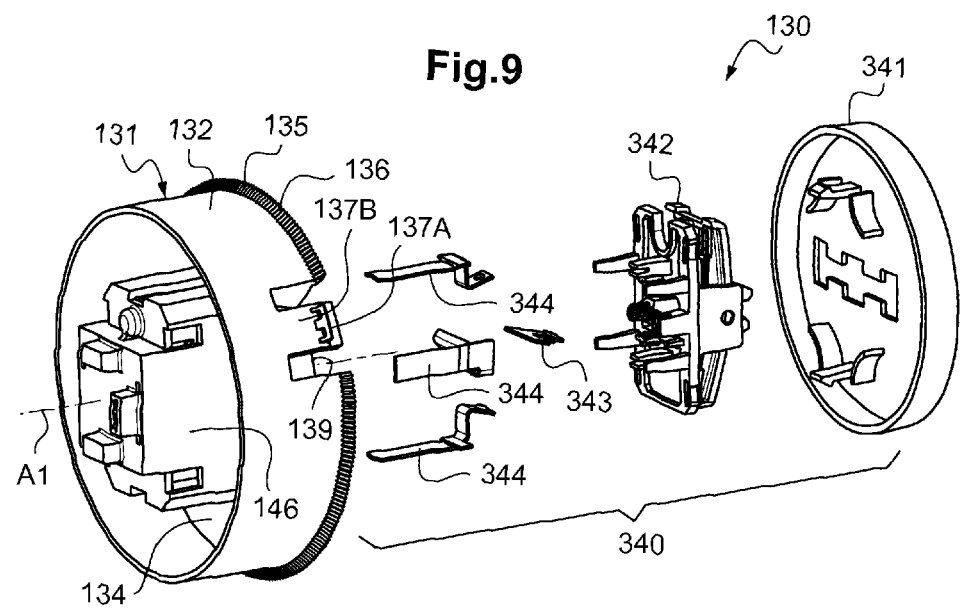

REMOVABLE ELECTRICAL-ACCESSORY MODULE, AN ELECTRICAL BOX FOR RECEIVING SUCH AN ACCESSORY MODULE, AND A REPLACEMENT METHOD FOR REPLACING SUCH AN ACCESSORY MODULE

TECHNICAL FIELD TO WHICH THE INVENTION RELATES

The invention provides an electrical-accessory module for engaging in an electrical box, said electrical-accessory module including a casing that is made of insulating material, and that comprises a side wall that is closed at the front by a front wall for defining an inside space for receiving an electrical mechanism.

The invention finds a particularly advantageous application in providing an accessory module that, by way of example, presents the function of an on/off switch, a two-way switch, a dimmer switch, a power-outlet, a network connector (RJ45), a telephone socket (RJ11), a digital visual interface (DVI) socket or the equivalent (high-definition multimedia interface (HDMI) socket, . . . ), an indicator-lamp, a thermostat, or a detector (of smoke, flood, temperature, movement, or light).

In addition, the invention provides an electrical box for flush mounting in a cavity formed in a wall, said electrical box comprising: a side wall that is open towards the front along a main axis, and that internally defines a reception volume for receiving an electrical-accessory module; holder means for holding said side wall in said cavity; and blocking means for blocking said electrical-accessory module in said reception volume.

The invention also provides an electrical accessory for flush mounting in a cavity formed in a wall, said electrical accessory comprising an electrical box and an electrical-accessory module as mentioned above.

The invention also provides a replacement method for replacing an old electrical-accessory module with a new electrical-accessory module.

TECHNOLOGICAL BACKGROUND

Currently, all electrical accessories for flush mounting are similar in structure.

Such an electrical accessory thus comprises: an electrical box that is open at the front and that is for fitting through an opening formed in the hollow partition; an accessory support in the form of a frame for fitting on the open front face of the electrical box; an accessory mechanism (e.g. a power-outlet or a switch mechanism) for blocking in the opening defined by the accessory support; and a finishing plate for fastening on the accessory support so that it hides said accessory support and so that it borders the accessory mechanism in attractive manner.

In particular, the accessory mechanism comprises an insulating block that houses connection terminals for connecting to the local electricity network, and that is closed at the front by a piece of trim that is user-accessible (a toggle or push button for an on/off switch or two-way switch, a connection well for a power outlet, . . . ).

The insulating block is generally snap-fastened in permanent manner in the accessory support, whereas the accessory support is fastened to the electrical box by means of screws, having heads that bear against the accessory support and having threaded shanks that are screw-fastened in corresponding screw-fastener wells provided in the electrical box.

Consequently, when the user wishes to replace the accessory mechanism with an improved mechanism, the user is forced to unscrew the screws that hold the accessory support on the electrical box, to remove the accessory support, to disconnect the mechanism carried by the support from the electric wires coming from the local electricity network, to replace the support and the mechanism with another accessory support carrying the new accessory mechanism, to reconnect the new mechanism, and then to tighten the screws, and this turns out to be tricky.

In order to install such an electrical accessory in an opening formed in a hollow partition, it is likewise necessary to implement a large number of operations.

It is thus necessary to pull at least one cable-routing conduit through the opening formed in the hollow partition, to engage the end of each conduit in the electrical box, to fasten the electrical box in the opening formed in the hollow partition, pushing each conduit back into the hollow partition, to screw-fasten the accessory support on the electrical box, taking care to place it vertically, to connect the electric wires coming from each conduit to the terminals of the accessory mechanism, to block the accessory mechanism in the accessory support, and to fit the finishing plate on the accessory support.

These operations are time-consuming and tricky to perform.

The number of elements necessary for fastening the electrical accessory on the hollow partition is also large, and this is costly.

Document DE 9 106 123 discloses an electrical accessory that is easier and quicker to assemble.

That electrical accessory includes an accessory mechanism for engaging in an electrical box having a side wall that presents two diametrally-opposite slots.

As described in that document, the accessory mechanism comprises a base and two opposite side tabs that extend from the rear wall of the base towards the front, and that carry snap-fastener teeth that are adapted to catch onto the slots of the electrical box. More precisely, the snap-fastener teeth are designed to pass through the slots and to catch onto the wall panel. In other words, the snap-fastener teeth make it possible not only to hold the accessory mechanism in the electrical box, but also to block the electrical box in the wall panel.

In addition, in that document, provision is made to use a finishing plate that is fastened to the edge of the electrical box, and that co-operates with the front ends of the side tabs so as to lock the side tabs in the slots of the side wall of the electrical box, so as to avoid them separating from the slots.

The major drawback of that electrical accessory is that it requires cavities to be formed in the wall panel for receiving the snap-fastener teeth of the accessory mechanism.

In practice, it turns out to be very difficult to form such cavities in the wall panel. Furthermore, when the wall panel is made of plaster (which might crumble), that type of fastening is not robust enough with regard to standards in force.

The dimensions of the cavities formed in the wall panel must also be adjusted very precisely (as a function of the dimensions of the side tabs of the mechanism). In practice, such a degree of accuracy is difficult to achieve when the cavities are hollowed out in the wall panel by means of tools.

In other words, there is a high risk that either the assembly cannot be mounted on the wall, or it presents very large clearance once mounted on the wall.

Another drawback is that the dimensions of the side tabs (in particular the positions of the snap-fastener teeth and of the front ends of the side tabs) must be adjusted very accurately so that they can guarantee their function of blocking the mechanism towards the front (by the snap-fastener teeth) and towards the rear (by the front ends of the flexible tabs), and so that they can guarantee their function of blocking the box in the wall. In practice, such a degree of accuracy is difficult to achieve for a mechanism that is intended to be mass produced.

In addition, although it is stated in that document that the assembly may be removed by removing the finishing plate, then by using a screw-driver to act on the front ends of the side tabs, via the sides of the mechanism, so as to cause the side tabs to flex, it nevertheless remains that such removal turns out to be tricky and requires the use of a tool.

Finally, the use of a finishing plate for fastening to the front edge of the electrical box turns out to be very troublesome in practice. Specifically, after the electrical box has been engaged in the wall panel, it often happens that said wall panel is covered with a covering (wallpaper, plaster, . . . ), such that the front edge of the electrical box is no longer accessible, and such that it is no longer possible to fasten the finishing plate thereto.

OBJECT OF THE INVENTION

In order to remedy the above-mentioned drawbacks of the prior art, the present invention proposes an accessory module that acts as a support and that is easy to replace.

More particularly, the invention proposes an electrical-accessory module as defined in the introduction, wherein there are provided:
  snap-fastener means that are adapted to catch onto the electrical box, which snap-fastener means include at least one catch member that is movable between a retracted position in which it does not hinder the insertion of the casing into said electrical box, and an extended position in which it is adapted to catch directly onto said electrical box; and
  release means for releasing the snap-fastener means, which release means are accessible via the front, through an access opening provided in said front wall, so as to return said catch member into its retracted position.

Thus, the electrical-accessory module may be extracted from the electrical box without difficulty. It could thus be envisaged that it is extracted without any tools.

In addition, by means of the invention, the accessory module simultaneously acts as an accessory support and an accessory mechanism, thereby making it easier to put into place in the electrical box, and making it less costly.

Finally, since it is no longer necessary to use an accessory support, the accessory module no longer presents a volume that is limited to the size of the central opening of the accessory support, but may present a larger volume for receiving an improved electrical mechanism of larger dimensions. In addition, since the snap-fastener means are operated via the front of the casing of the accessory module, the release means and the snap-fastener means may be housed in the casing, thereby leaving more space in the electrical box for the casing.

Preferably, the snap-fastener means have the exclusive function of fastening the accessory module in the box. In contrast, they do not intervene in fastening the box in the wall panel. It is thus possible to fit the box with fastener means for fastening in the wall panel, which fastener means are distinct from the snap-fastener means, and, in contrast to the fastener means in document DE 9 106 123, they are adapted to catch onto any type of wall, without it being necessary to provide arrangements in the wall that are dedicated to the fastener means.

The electrical-accessory module of the invention has other characteristics that are advantageous and non-limiting, as follows:
  said catch member is carried by a flexible tab that is situated flush with the side wall of the casing;
  said flexible tab is cut out in the side wall of the casing in such a manner that, at rest, said catch member is in its extended position;
  at least two catch members are provided that are regularly distributed around the casing;
  since the side wall of the casing is substantially circular about a main axis, angular blocking means are provided for blocking the casing in the electrical box, about the axis;
  said angular blocking means comprise at least two distinct sets of serrations that are situated on a single circle centered on said main axis;
  said angular blocking means comprise a compressible layer that extends over at least one circular arc centered on said main axis;
  the casing includes an outer collar that borders the side wall at the front, and that has a rear face that is designed to bear against the front face of said electrical box, and said angular blocking means are situated on said rear face of the outer collar;
  said catch member is carried by a flexible tab, said flexible tab includes a rim having a rear face that is designed to bear against the front edge of said electrical box, and said angular blocking means are exclusively situated on the rear face of the rim of the flexible tab;
  said angular blocking means are situated on a rear wall of said casing;
  the front wall of the casing includes an access window for accessing said inside space that is closed by trim of the electrical mechanism;
  the front wall of the casing includes securing means for securing a finishing plate;
  the casing includes partitions that are arranged in said inside space, which partitions are formed integrally with a rear wall and/or with the side wall and/or with the front wall, and define a housing for receiving and blocking an electrical-connection terminal for connecting the electrical mechanism to the local electricity network; and
  the casing includes an outer collar that borders the side wall at the front, and that has a rear face that slopes outwards.

The invention also proposes an electrical box as defined in the introduction that is adapted to receive an electrical-accessory module as mentioned above, and that has blocking means that comprise, for this purpose, set back into the inside face of said side wall, an abutment face that faces towards the rear, and onto which snap-fastener means of said electrical-accessory module are adapted to catch.

The electrical box of the invention has other characteristics that are advantageous and non-limiting, as follows:
  said side wall presents at least one slot that is elongate along an axis that is orthogonal to said main axis, having a front edge that forms said abutment face;
  set back into a fraction of the thickness of its inside face, said side wall presents a groove that is elongate along an axis that is orthogonal to said main axis, having a front edge that forms said abutment face;

since the side wall is substantially circular about a main axis, angular blocking means are provided for blocking the electrical-accessory module in said reception volume, about the main axis;

said angular blocking means comprise at least two distinct sets of serrations that are situated on a single circle centered on said main axis;

said angular blocking means comprise a compressible layer that extends over at least one circular arc centered on said main axis;

an outer collar is provided that borders the side wall at the front, and said angular blocking means are situated on the front face of the outer collar;

the side wall is closed at the rear by a rear wall, and said angular blocking means are situated at the front end of tabs that project from the rear wall and/or along the side wall.

The invention also proposes an electrical accessory for flush mounting in a cavity formed in a wall, said electrical accessory comprising:

an electrical box that includes a side wall; and an electrical-accessory module as mentioned above, of which said catch member is adapted to catch onto a corresponding abutment face that is provided in the inside face of said side wall.

The invention also proposes a replacement method for replacing an old electrical-accessory module with a new electrical-accessory module, said old electrical-accessory module initially being blocked in an electrical box, wherein:

a) the release means of said old electrical-accessory module are moved so as to return each catch member into its retracted position;

b) said old electrical-accessory module is extracted from said electrical box; and c) said new electrical-accessory module is engaged in said electrical box.

The replacement method of the invention has other characteristics that are advantageous and non-limiting and that are as follows:

said step a) is performed manually, without any tools; and said step c) is performed automatically, without moving the release means of the new electrical-accessory module.

DETAILED DESCRIPTION OF AN EMBODIMENT

The following description of non-limiting examples given with reference to the accompanying drawings, makes it possible to understand what the invention consists of and how it can be reduced to practice.

In the accompanying drawings:

FIG. 2 is a view of a detail of the outer collar of the FIG. 1 electrical box;

FIG. 3 is a view of a detail of the outer collar of the FIG. 1 electrical-accessory module;

FIGS. 4 and 5 are diagrammatic perspective views of a first variant embodiment of the electrical-accessory module and of the electrical box for receiving the electrical-accessory module;

FIGS. 6 and 7 are diagrammatic perspective views of a second variant embodiment of the electrical-accessory module and of the electrical box for receiving the electrical-accessory module; and FIGS. 8 and 9 are diagrammatic perspective views of two other variant embodiments of the FIG. 1 electrical-accessory module.

Figure 1:
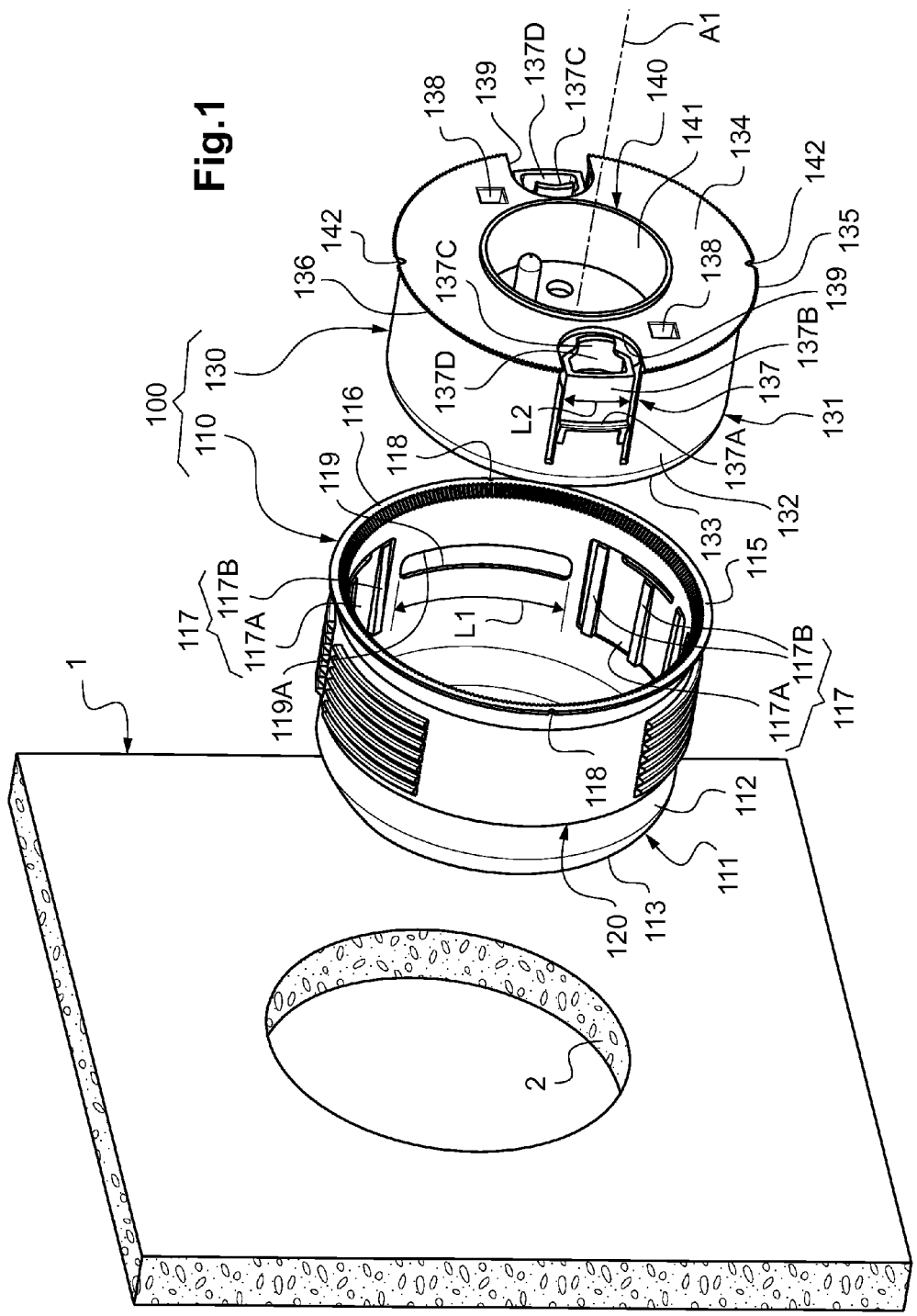
FIG. 1 is an exploded diagrammatic perspective view of an electrical accessory for flush mounting in a hollow partition, said figure showing an electrical-accessory module of the invention and an electrical box.

Firstly, it should be observed that elements of the various variant embodiments of the invention shown in the various figures that are identical or similar are, as far as possible, referenced using the same references, and they are not described each time.

FIG. 1 shows an electrical accessory 100 comprising an electrical-accessory module 130 and an electrical box 110.

The electrical accessory 100 is of the type for flush mounting in a cavity 2 formed in a wall 1.

The electrical box 110 thus makes it possible not only to fasten the electrical-accessory module 130 rigidly in the wall 1, but also to protect it.

The term "electrical-accessory module" means any type of module, such as a power-outlet, an on/off switch, a two-way switch, a dimmer switch, a network connector (RJ45), a telephone socket (RJ11), an indicator-lamp, or a detector (of smoke, flood, temperature, movement, or light).

In the embodiment shown in the figures, the electrical-accessory module 130 is designed more precisely to be flush mounted in a hollow partition.

On this topic, it should be observed that, in known manner, such a hollow partition is generally made up of a metal frame (formed of vertical uprights and horizontal rails that are not shown) and plasterboards 1 that are fitted on at least one of the two faces of the metal frame.

As shown in FIG. 1, in this embodiment, the cavity formed in the hollow partition is formed merely by a circular opening 2 that is made, using a crown saw, in one of the plasterboards 1.

In the description, the terms "front" and "rear" are thus used relative to the direction in which the electrical-accessory module 130 in the circular opening 2 faces the installer. Thus, the terms "front" and "rear" designate the outwardly-facing locations of the hollow partition and the inwardly-facing locations of the hollow partition respectively.

FIG. 1 shows a particular embodiment of the electrical box 110, which embodiment makes it possible to show the way in which the electrical-accessory module 130 may be fastened in the hollow partition.

The electrical box 110 includes a body 111 that, in this embodiment, presents a shape that is generally cylindrical, but naturally it could present some other shape, in particular a shape that is a rectangular parallelepiped.

The body 111 comprises a side wall 112 that is circularly tubular about an axis A1, that is closed at the rear by a rear wall 113, and that is open towards the front. The body 111 thus defines an internal reception housing for receiving the electrical-accessory module 130.

In order to fasten the body 111 of the electrical box 110 in the circular opening 2 formed in the plasterboard 1, said body includes an outer collar 115 that extends externally around the edge of the front opening of the side wall 112, and that is adapted to bear against the front face of the plasterboard 1, all around the circular opening 2. Thus, the outer collar 115 makes it possible to block the body 111 of the electrical box 110 towards the rear.

In order to block it towards the front, the side wall 112 of the electrical box 110 includes fastener means 117 that are adapted to catch onto the rear of the plasterboard 1.

The fastener means are described in greater detail in the description below.

As shown in FIG. 1, the accessory module 130 for fitting into the electrical box 110 is designed to offer the desired electrical function to the user, in this embodiment a power-outlet function. It is in the form of an "all-in-one" block that is adapted to be fitted directly into the body 111 of the electrical box 110.

The electrical-accessory module 130 comprises a casing 131 that is made of insulating material, and that is of shape that is substantially identical to the shape of the inside volume defined by the body 111 of the electrical box 110. In this embodiment, it thus presents a shape that is substantially circularly-cylindrical about an axis A1. The shape of the casing 131 thus makes it possible to take advantage of the entire inside volume defined by the body 111 of the electrical box 110.

As shown in FIG. 1, the casing 131 includes a side wall 132 that is circularly cylindrical about the axis A1, that, in this embodiment, is closed at the rear by a rear wall 133 that is substantially circular, and that is closed at the front by a front wall 134 that is substantially circular. The casing 131 thus defines an inside space for receiving an electrical mechanism 140 (in this embodiment, a power outlet mechanism).

The casing 131 also includes an outer collar 135 that borders the side wall 132 at the front, and that is designed to bear against the front face of the outer collar 115 of the electrical box 110.

According to a particularly advantageous characteristic of the invention, the casing 131 includes snap-fastener means 137 that are adapted to catch onto the electrical box 110, and, in order to release them from the electrical box 110, release means 137C for releasing the snap-fastener means 137, which release means are accessible via the front, through an access opening 139 provided in the front wall 134 of the casing 131.

In the invention, the snap-fastener means 137 include at least one catch member 137A that is movable between a retracted position in which it does not hinder the insertion of the casing 131 into the electrical box 110, and an extended position in which it is adapted to catch directly onto the electrical box 110. The release means 137C are thus designed to return the catch member 137A into its retracted position.

In this embodiment, at rest, each catch member 137A is positioned in its extended position. Consequently, the release means 137C are designed to retract each catch member 137A into its retracted position.

In a variant, provision could be made for each catch member to be positioned, at rest, in its retracted position, in which event the release means would be designed to deploy each catch member 137A into its extended position.

In practice, as shown in FIG. 1, the snap-fastener means 137 comprise two flexible tabs 137B that are cut out in the side wall 132 of the casing 131, that carry respective snap-fastener teeth 137A (acting as catch members) on their outer faces, and that are releasable by levers 137C.

The two flexible tabs 137B are situated in diametrally-opposite manner relative to the axis A1. They extend lengthwise from the front edge of the side wall 132 of the casing 131, to the rear. Each flexible tab 137B presents the shape of a rectangle having three edges that are free, and having a fourth edge, namely the rear edge in this embodiment, that forms the base of the flexible tab 137B in that it is connected to the remainder of the side wall 132 of the casing 131, so as to form a hinge. At rest, the flexible tabs 137B extend flush with the remainder of the side wall 132 of the casing 131.

Each snap-fastener tooth 137A is thus situated at a distance from the hinge. Each snap-fastener tooth 137A presents a front face that is plane and orthogonal to the axis A1, and a rear face that slopes relative to the axis A1.

The rear face of each snap-fastener tooth 137A forms a ramp that enables the flexible tab 137B to deform resiliently inwards when the casing 131 is engaged in the electrical box 110, such that the corresponding snap-fastener tooth 137A does not form an obstacle to engaging the electrical-accessory module 130 inside the electrical box 110.

The front face of each snap-fastener tooth 137A is designed to catch onto a corresponding abutment face 119A that is provided in the electrical box 110, and that extends orthogonally to the axis A1. In this embodiment, the abutment face is formed by the front edge 119A of a rectangular slot 119 provided in the side wall 112 of the electrical box 110. The abutment face thus forms blocking means for blocking the electrical-accessory module 130 in the electrical box 110.

In addition, each snap-fastener tooth 137A is designed to be housed entirely in the rectangular slot 119 provided in the side wall 112 of the electrical box 110. There is no provision for it to project outside the side wall 112, so it does not interfere with the plasterboard 1.

In this embodiment, two distinct and diametrally-opposite rectangular slots 119 are provided, each presenting a length L1 that is strictly greater than the length L2 of the snap-fastener teeth 137A. Thus, when the snap-fastener teeth 137A catch onto the front edges 119A of the rectangular slots 119, they do not prevent the casing 131 from turning relative to the electrical box 110, about the axis A1.

As shown clearly in FIG. 1, a lever 137C is provided for releasing each flexible tab 137B. Each of the levers 137C is in the form of an arch that is connected to the flexible tab 137B.

Each lever 137C thus includes a wall that is semi-circular about an axis that is parallel to the axis A1, which wall is connected via its two lateral end edges to the inside face of the flexible tab 137B, so as to co-operate with said flexible tab to define a cavity 137D in which the installer can insert a finger.

In this embodiment, the openings provided in the front wall 134 of the casing 131 to access the cavities 137D are thus formed by diametrally-opposite notches 139 that are set back into the edge of the front wall 134 of the casing 131.

Thus, by inserting a thumb and a finger into these two cavities 137D, and by pinching the two levers 137C towards each other, the installer can release the flexible tabs 137B. In this way, the installer can force each snap-fastener tooth 137A to disengage from each rectangular slot 119 of the electrical box 110, thereby making it possible to extract the casing 131 at leisure from the electrical box 110.

As a result, after the electrical-accessory module 130 has been snap-fastened in the electrical box 110, the installer can easily extract it therefrom, e.g. in order to replace it with a new improved electrical-accessory module.

As shown in FIGS. 1 and 3, the outer collar 135 presents a front face that is plane and orthogonal to the axis A1 and that is flush with the front face of the front wall 134 of the casing 131, and a rear face that slopes outwards and that thus presents a shape that is frustoconical.

As shown in FIGS. 1 and 2, the inner edge 136 provided at the junction between the side wall 112 and the outer collar 115 of the electrical box 110 is thus beveled in corresponding manner, so as to present an identical frustoconical shape. In this way, when the casing 131 of the electrical-accessory module 130 is engaged in the electrical box 110, its outer collar 135 bears via its rear face 136 against the beveled edge 116 of the electrical box 110, thereby making it possible to center the casing 131 automatically about the axis A1 of the electrical box 110.

Advantageously, the electrical-accessory module 130 and the electrical box 110 include angular blocking means for blocking the casing 131 in the body 111 of the electrical box 110 about the axis A1.

As described below with reference to FIGS. 4 to 7, the angular blocking means could present various shapes.

As shown in FIGS. 1 to 3, the angular blocking means comprise two series of serrations that are arranged on the body 111 of the electrical box 110 and on the casing 131 of the electrical-accessory module 130 respectively, and that are adapted to mesh together.

Thus, as shown in FIG. 2, the beveled inner edge 116 of the electrical box 110 is serrated over its entire periphery. In this embodiment, it presents three hundred and sixty projecting serrations that are distributed regularly about the axis A1. In this embodiment, each of the serrations extends along a respective axis that is radial relative to the axis A1, and they all present the same triangular shape.

As shown in FIG. 3, the rear face 136 of the outer collar 135 is thus serrated in corresponding manner. Since the outer collar 135 of the casing 131 of the electrical-accessory module 130 is interrupted at the flexible tabs 137B, the series of serrations provided on the casing is also interrupted at the two flexible tabs 137B.

As a result of the serrations, when the electrical-accessory module 130 is fitted into the electrical box 110, the serrated rear face 136 of its outer collar 135 comes to mesh with the beveled and serrated inner edge 116 of the electrical box 110.

The snap-fastener means 137 of the casing 131 thus catch onto the slots 119 provided in the electrical box 110 only when the serrations of the rear face 136 of the outer collar 135 of the casing 131 have become fully engaged in the serrations of the inner edge 116 of the electrical box 110.

At this stage, it is nevertheless still possible to modify the angular position of the casing 131 in the electrical box 110 about the axis A1, by moving the levers 137C so as to extract the casing 131 a little from the electrical box 110 so as to disengage the serrations from one another.

Naturally, in a variant, provision could be made for the electrical-accessory module and/or the electrical box to present a smaller number of serrations. Provision could thus be made for the electrical-accessory module to include only one serration that comes to be engaged in one or another of the three hundred and sixty serrations of the electrical box.

As shown in FIG. 1, the casing 131 houses an electrical mechanism 140, in this embodiment a power-outlet mechanism, in such a manner that only the trim 141 of the electrical mechanism 140 emerges at the front of the casing 131.

To this end, at its center, the front wall 134 of the casing 131 presents an access window for access into the casing 131 that is closed by the trim 141.

Since the electrical mechanism 140 presents a power-outlet function, the trim 141 forms a reception well for receiving an electric plug.

The rear wall of the trim 141 is thus perforated with two first openings for passing the pins of the electric plug, and with a third opening for passing a ground pin of the electrical mechanism 140.

The internal portion of the electrical mechanism 140, which is housed inside the casing 131 and which is not shown in the figures, thus includes three electrical-connection terminals. The three electrical-connection terminals are connected respectively to the ground pin and to two reception sockets for receiving the pins of the electric plug (situated at the rear of the above-mentioned two first openings). In addition, they are designed to be connected to the local electricity network.

Since the way in which the three electrical-connection terminals are connected to the local electricity network is not in itself the subject of the present invention, it is not described in detail.

However, it is possible to envisage that the three electrical-connection terminals are accessible via the rear of the casing 131, so that three electric wires, i.e. line, neutral, and earth, coming from the local electricity network can by connected thereto.

It is also possible to envisage having the three electrical-connection terminals projecting from the rear of the casing 131, so that they can be connected to a terminal block provided on the rear wall of the electrical box, and also suitable for being connected to the three electric wires coming from the local electricity network.

In any event, the electrical-connection terminals are held in the reception housings that are provided inside the casing 131 and that are defined by internal partitions formed integrally with the rear wall 133 and/or with the side wall 132 of the casing 131.

As also shown in FIG. 1, the front wall 134 of the casing 131 also includes securing means 138 for securing a finishing plate (not shown).

In conventional manner, such a finishing plate is designed to border the trim 141 of the electrical mechanism 140, and to cover the casing 131 of the electrical-accessory module 130 in attractive manner.

The front wall 134 of the casing 131 thus presents two holes 138 in which corresponding snap-fastener lugs projecting from the rear face of the finishing plate could be received.

Fastening the finishing plate to the casing 131 (and not to the electrical box 110) is advantageous. Specifically, after the electrical box 110 has been engaged in the circular opening 2 formed in the plasterboard 1, it often happens that the plasterboard is covered with a covering (wallpaper, plaster, . . . ), such that the front edge of the electrical box is no longer accessible for fastening the finishing plate thereto. In contrast, the front wall 134 of the casing 131 is not designed to be covered by the covering, so that it remains easily accessible for mounting the finishing plate.

In this embodiment, each of the rear and front walls 133, 134 of the casing is made as a single piece. In this embodiment, they are made as respective single pieces by molding a plastics material (e.g. polypropylene). While one of them is formed integrally with at least a portion of the side wall 132, the other is snap-fastened on the side wall 132.

As shown in FIG. 1, the above-mentioned fastener means 117 for fastening the electrical box 110 in the circular opening 2 formed in the plasterboard 1 are of a particular type.

Specifically, they comprise four rectangular flaps 117A that are cut out in the side wall 112 of the electrical box 110, each of said flaps having three edges that are free, and having a fourth edge, namely the front edge in this embodiment, that is connected to the remainder of the side wall 112 via two tabs that form a hinge. At rest, the four flaps 117A are in their retracted position, i.e. their outer faces are situated flush with the outer face of the remainder of the side wall 112 of the electrical box 110.

Projecting from its inside face, each of the four flaps 117A includes a ramp 117B having thickness that increases going from front to rear. Thus, when the electrical-accessory module 130 is fitted into the electrical box 110, it bears against the ramps 117B, thereby making it possible to deploy the flaps 117A into their extended positions, i.e. projecting from the outer face of the side wall 112.

In this embodiment, the side wall 112 of the body 111 of the electrical box 110 carries a peripheral band 120 of compressible material that, in particular, covers the flaps 117A. In this embodiment, at each of the flaps 117A, the peripheral band 120 presents parallel ribs that project from its outer face.

In this way, when they are deployed, the flaps 117A compress the ribs of the peripheral band 120 against the edge of the circular opening 2 formed in the plasterboard 1, thereby enabling the electrical box 110 to be fastened in the circular opening 2.

Consequently, the fastener means 117 co-operate with the outer collar 115 to form holder means for holding the electrical box 110 in the circular opening 2.

In this embodiment, the rear wall 113 of the electrical box 110 includes a knock-out portion (not shown) that makes it possible to open up a passage for a cable-routing conduit containing the electric wires for connecting to the electrical-connection terminals of the electrical-accessory module 130.

The electrical accessory 100 is thus installed in the circular opening 2 formed in the plasterboard 1 as follows.

The free end of the cable-routing conduit is initially pulled to the outside of the hollow partition, through the circular opening 2.

The installer then engages the end of the cable-routing conduit in the electrical box 110, through the opening opened up beforehand by means of the knock-out portion. The installer then connects the free ends of the electric wires contained in the cable-routing conduit to the electrical-accessory module 130.

The installer then fits the electrical box 110 into the circular open 2 formed in the plasterboard 1, taking care that its peripheral collar 115 bears flat against the plasterboard 1.

At this stage, the installer should adjust the orientation of the electrical box 110 in the circular opening 2. This is done with the help of two diametrally-opposite notches 118 that are set back into the outer edge of the peripheral collar 115 of the electrical box 110, and that indicate the horizontal.

The installer then fits the electrical-accessory module 130 directly into the electrical box 110, taking care that the serrated rear face 136 of its outer collar 135 meshes fully with the serrations of the inner edge 116 of the electrical box 110, and that the snap-fastener teeth 137A catch properly onto the front edges 119A of the slots 119 provided in the side wall 112 of the electrical box 110.

During this engagement, the casing 131 of the electrical-accessory module 130 bears against the ramps 117B of the flaps 117A of the electrical box 110, thereby making it possible to block said electrical box in the circular opening 2 formed in the plasterboard 1. During this engagement, the installer should also adjust the orientation of the electrical-accessory module 130 in the electrical box 110. This is done with the help of two diametrally-opposite notches 142 that are set back into the outer edge of the peripheral collar 135 of the electrical-accessory module 130, and that indicate the vertical.

Finally, the installer completes the installation of the electrical accessory 100 by fitting the finishing plate on the front wall 134 of the casing 131 of the electrical-accessory module 130.

At a later date, the user may wish to replace the electrical-accessory module 130, e.g. with a new improved accessory module.

To do this, the user removes the finishing plate, e.g. by means of a screwdriver.

The user then moves the levers 137C of the old electrical-accessory module 130, so as to disengage the snap-fastener teeth 137A from the rectangular slots 119 of the electrical box 110.

The user then extracts the old electrical-accessory module 130 from the electrical box 110, and replaces it with the new electrical-accessory module. Naturally, the new electrical-accessory module may be engaged without moving its levers.

Finally, the user fits the finishing plate on the casing of the new electrical-accessory module 130.

The present invention is not limited to the embodiment described and shown, and the person skilled in the art can apply any variation thereto in accordance with the spirit of the invention.

Thus, FIGS. 4 and 5 show a first variant embodiment of the electrical-accessory module 130 and of the electrical box 110.

Firstly, in FIG. 4, it should be observed that the connection means for connecting the electrical-accessory module 130 to the electric wires coming from the local electricity network are not shown, since they are not the subject of the present invention. In FIG. 5, it should also be observed that, for the same reasons, the knock-out portion at the rear wall of the electrical box 110 is not shown.

In this variant, as shown in FIG. 4, the outer collar 135 of the casing 131 of the electrical-accessory module 130 is not interrupted at the flexible tabs 137B.

Specifically, on its outer face, each of the flexible tabs 137B carries a rim 137E that extends flush with the outer collar 135, and that thus presents a front face that is orthogonal to the axis A1 and a rear face 137F that slopes outwards.

In this embodiment, the serrations are provided exclusively on the rear faces 137F of the rims 137E of the flexible tabs 137B. In this way, when the installer needs to adjust the angular position of the electrical-accessory module 130 in the electrical box 110, the installer needs to move the levers 137C only, in order to move the serrations away from the electrical box 110. The installer is thus no longer obliged to extract the electrical-accessory module 130 a little from the electrical box 110 in order to move its serrations away from the electrical box 110.

In this variant, provision could be made for the electrical box 110 to present a shape that is identical to the shape shown in FIG. 1. However, in this embodiment, its beveled inner edge 116 does not have serrations. In contrast, it carries a strip 116A of compressible material for catching by the serrations of the electrical-accessory module 130. By way of example, the strip 116A may be made out of polystyrene-b-poly(ethylene-butylene)-b-polystyrene (SEBS) that is overmolded on the beveled inner edge 116 of the electrical box 110.

In addition, in FIG. 5, it should be observed that unlike the peripheral band 120 of the electrical box 110 shown in FIG. 1, the peripheral band 120 of this embodiment does not have parallel projecting ribs. However, the function of the peripheral band 120 remains unchanged.

FIGS. 6 and 7 show a second variant embodiment of the electrical-accessory module 130 and of the electrical box 110.

Firstly, in FIG. 6, it should be observed that the connection means for connecting the electrical-accessory module 130 to the electric wires coming from the local electricity network are not shown, since they are not the subject of the present invention. In FIG. 7, it should also be observed that, for the same reasons, the knock-out portion at the rear wall of the electrical box 110 is not shown.

In this variant, as shown in FIG. 6, on its outer face, each flexible tab 137B carries a rim 137E that extends flush with the outer collar 135.

In this embodiment, neither the rims 137E nor the outer collar 135 carries serrations.

The serrations are set back exclusively into the rear face of the rear wall 133 of the casing 131. They are situated along the entire periphery of the rear wall 133, in a circular ring 136B about the axis A1.

In this variant, the beveled inner edge 116 of the electrical box 110 carries neither serrations, nor strips of compressible material.

In contrast, projecting from the front face of its rear wall 113, the electrical box 110 carries four rigid tabs 118A having free ends that carry serrations 118B that are adapted to mesh with the serrations provided on the rear wall 133 of the casing 131.

In this embodiment also, the peripheral band 120 that covers a portion of the side wall 112 of the body 111 of the electrical box 110 does not have parallel projecting ribs.

In other variant embodiments of the invention, the series of serrations provided at the rear of the casing, in FIG. 6, could be replaced with a circular strip of compressible material, for example. More generally, provision could be made for the serrations to be situated either on the electrical box or on the casing of the electrical-accessory module, and for the compressible material to be situated on the other element. The serrations and the compressible material could thus be positioned equally well on the rear of the electrical box and of the electrical-accessory module as on the front.

In another variant embodiment of the invention that is not shown in the figures, provision could be made for the snap-fastener means for fastening the electrical-accessory module in the electrical box to present some other form.

They could thus comprise two flexible tabs that are identical to the flexible tabs shown in FIG. 1, but each without a snap-fastener tooth, and each coated on its outer face with a compressible layer that is suitable for catching onto the front edge of a corresponding slot formed in the side wall of the electrical box.

In addition, provision could also be made for the electrical box to include not two rectangular slots having ends that limit the turning amplitude of the accessory module, but one peripheral groove that is set back into the inside face of the side wall of the electrical box. Since the peripheral groove extends over the entire perimeter of the side wall of the electrical box, it does not limit the degree to which the accessory module can turn in the electrical box.

Still in a variant, provision could also be made for the outer collar of the electrical box 110 and/or of the electrical-accessory module 130 to be discontinuous.

FIGS. 8 and 9 show third and fourth variant embodiments of the electrical-accessory module 130 respectively.

In both variants, the casing 131 of the electrical-accessory module 130 includes a side wall 132 (still circularly cylindrical in shape) that is closed at the front by a front wall 134, but that is open at the rear. Both of these variant embodiments of the electrical-accessory module 130 operate in a manner identical to that described above, and the way in which the electrical accessory is used remains unchanged.

The main advantage is to make it possible to manufacture casings 131 with a smaller volume of first material.

In the third variant embodiment of the accessory module 130 shown in FIG. 8, the front wall 134 of the casing 131 presents a setback 145 that defines an insertion well for inserting an electric plug.

The electrical mechanism 240 housed in the casing 131 (in this embodiment, a power-outlet mechanism) comprises an insulating block 241 inside which three electrical-connection terminals are housed.

Inside the block 241, two of the connection terminals comprise reception sockets for receiving the pins of the electric plug, and, at the rear of the block 241, connection pins 242 for connecting to the local electricity network. The third of the connection terminals comprises, at the front of the block 241, a ground pin 244, and, at the rear of the block 241, a connection pin 243 for connecting to the local electricity network.

The block 241 is thus fitted with fastener means for fastening in the casing 131. In this embodiment, the fastener means are in the form of snap-fastener tabs 246 that are adapted to catch onto cavities provided in lugs 247 that extend from the rear face of the rear wall of the setback 145 provided in the front wall 134 of the casing 131.

In the fourth variant embodiment of the accessory module 130 shown in FIG. 9, the front wall 134 of the casing 131 presents a setback 146 that defines a housing for housing the electrical mechanism 340.

In this embodiment, the electrical mechanism 340 that is a switch mechanism, includes trim that is made of two parts. The trim is constituted by a toggle button (not shown in the figures) that is designed to be mounted in movable manner on the casing 131, and a rear plate 341 that is fastened on the casing 131. The electrical mechanism 301 also includes a toggle system 342 having a stationary portion that is fastened to the casing 131, and having a movable portion that is driven by the toggle button, a movable contact 343 that is driven by the toggle system 342, and three stationary terminals 344.

The electrical mechanism 340 (excluding its trim) is designed to be secured inside the housing defined by the setback 146 in the front wall 134 of the casing 131.

The invention claimed is:

1. An electrical-accessory module for engaging in an electrical box, said electrical-accessory module including a casing that is made of insulating material, and that comprises a side wall that is closed at the front by a front wall for defining an inside space for receiving an electrical mechanism;

wherein said electrical-accessory module includes:
    snap-fastener means that are adapted to catch onto the electrical box, which snap-fastener means include at least one flexible tab that carries a snap-fastener teeth and that is releasable by a lever, which snap-fastener teeth is movable between a retracted position in which it does not hinder the insertion of the casing into said electrical box, and an extended position in which it is adapted to catch directly onto said electrical box; and
    release means comprising said lever for releasing the snap-fastener means, which release means are accessible via the front, through an access opening provided in said front wall, so as to return said snap-fastener teeth into its retracted position.

2. An electrical-accessory module according to claim 1, wherein said flexible tab is situated flush with the side wall of the casing.

3. An electrical-accessory module according to claim 2, wherein said flexible tab is cut out in the side wall of the casing in such a manner that, at rest, said snap-fastener teeth is in its extended position.

4. An electrical-accessory module according to claim 1, wherein at least two snap-fastener teeth are provided that are regularly distributed around the casing.

5. An electrical-accessory module according to claim 1, wherein, since the side wall of the casing is substantially circular about a main axis, angular blocking means are provided for blocking the casing in the electrical box, about the main axis.

6. An electrical-accessory module according to claim 5, wherein said angular blocking means comprise at least two distinct serrations that are situated on a single circle centered on said main axis.

7. An electrical-accessory module according to claim 5, wherein said angular blocking means comprise a compressible layer that extends over at least one circular arc centered on said main axis.

8. An electrical-accessory module according to claim 5, wherein the casing includes an outer collar that borders the side wall at the front, and that has a rear face that is designed to bear against the front face of said electrical box, and wherein said angular blocking means are situated on said rear face of the outer collar.

9. An electrical-accessory module according to claim 5, wherein said flexible tab includes a rim having a rear face that is designed to bear against the front edge of said electrical box, and wherein said angular blocking means are exclusively situated on the rear face of the rim of the flexible tab.

10. An electrical-accessory module according to claim 5, wherein said angular blocking means are situated on a rear wall of said casing.

11. An electrical-accessory module according to claim 1, wherein the front wall of the casing includes an access window for accessing said inside space that is closed by trim of the electrical mechanism.

12. An electrical-accessory module according to claim 1, wherein the front wall of the casing includes securing means for securing a finishing plate.

13. An electrical-accessory module according to claim 1, wherein the casing includes partitions that are arranged in said inside space, which partitions are formed integrally with a rear wall of said casing or with the side wall or with the front wall, and define a housing for receiving and blocking an electrical-connection terminal for connecting the electrical mechanism to the local electricity network.

14. An electrical-accessory module according to claim 1, wherein the casing includes an outer collar that borders the side wall at the front, and that has a rear face that slopes outwards.

15. An electrical accessory for flush mounting in a cavity formed in a wall, said electrical accessory comprising:
an electrical box comprising:
a side wall that is open towards the front along a main axis, and that internally defines a reception volume for receiving an electrical-accessory module;
holder means for holding said side wall in said cavity, enabling the electrical box to be fastened in the cavity; and
blocking means for blocking said electrical-accessory module in said reception volume;
wherein said blocking means comprise, set back into the inside face of said side wall, an abutment face that faces towards the rear, and onto which snap-fastener means of said electrical-accessory module are adapted to catch, and
an electrical-accessory module according to claim 1, of which said snap-fastener teeth is adapted to catch onto a corresponding abutment face that is provided in the inside face of said side wall.

16. A replacement method for replacing an old electrical-accessory module with a new electrical-accessory module according to claim 1, said old electrical-accessory module initially being blocked in an electrical box, wherein:
a) the release means of said old electrical-accessory module are moved so as to return each snap-fastener teeth into its retracted position;
b) said old electrical-accessory module is extracted from said electrical box; and
c) said new electrical-accessory module is engaged in said electrical box.

17. A replacement method according to claim 16, wherein said step a) is performed manually, without any tools.

18. A replacement method according to claim 16, wherein said step c) is performed automatically, without moving the release means of the new electrical-accessory module.

19. An electrical box for flush mounting in a cavity formed in a wall, said electrical box comprising:
a side wall that is open towards the front along a main axis, and that internally defines a reception volume for receiving an electrical-accessory module;
holder means for holding said side wall in said cavity, enabling the electrical box to be fastened in the cavity; and
blocking means for blocking said electrical-accessory module in said reception volume;
wherein said blocking means comprise, set back into the inside face of said side wall, an abutment face that faces towards the rear, and onto which snap-fastener means of said electrical-accessory module are adapted to catch.

20. An electrical box according to claim 19, wherein said side wall presents at least one slot that is elongate along an axis that is orthogonal to said main axis, having a front edge that forms said abutment face.

21. An electrical box according to claim 19, wherein, set back into a fraction of the thickness of its inside face, said side wall presents a groove that is elongate along an axis that is orthogonal to said main axis, having a front edge that forms said abutment face.

22. An electrical box according to claim 19, wherein, since the side wall is substantially circular about a main axis, angular blocking means are provided for blocking the electrical-accessory module in said reception volume, about the main axis.

23. An electrical box according to claim 22, wherein said angular blocking means comprise at least two distinct serrations that are situated on a single circle centered on said main axis.

24. An electrical box according to claim 22, wherein said angular blocking means comprise a compressible layer that extends over at least one circular arc centered on said main axis.

25. An electrical box according to claim 22, wherein an outer collar is provided that borders the side wall at the front, and wherein said angular blocking means are situated on the front face of the outer collar.

26. An electrical box according to claim 22, wherein the side wall is closed at the rear by a rear wall, and wherein said angular blocking means are situated at the front end of tabs that project from the rear wall or along the side wall.

* * * * *